United States Patent
Habitz et al.

(10) Patent No.: US 7,684,969 B2
(45) Date of Patent: Mar. 23, 2010

(54) FORMING STATISTICAL MODEL OF INDEPENDENTLY VARIABLE PARAMETERS FOR TIMING ANALYSIS

(75) Inventors: Peter A. Habitz, Hinesberg, VT (US); Mark R. Lasher, Colchester, VT (US); William J. Livingstone, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 11/219,205

(22) Filed: Sep. 2, 2005

(65) Prior Publication Data

US 2007/0055487 A1 Mar. 8, 2007

(51) Int. Cl.
G06F 17/50 (2006.01)
G06F 9/45 (2006.01)

(52) U.S. Cl. .............................. 703/14; 716/6
(58) Field of Classification Search ..................... 716/6; 703/2, 14
See application file for complete search history.

(56) References Cited

U.S. PATENT DOCUMENTS

| | | | | |
|---|---|---|---|---|
| 5,559,715 A | * | 9/1996 | Misheloff | 703/19 |
| 6,978,229 B1 | * | 12/2005 | Saxena et al. | 703/4 |
| 2004/0060021 A1 | * | 3/2004 | Sakano | 716/6 |
| 2004/0122642 A1 | * | 6/2004 | Scheffer | 703/14 |

OTHER PUBLICATIONS

Neil H. E. Weste and K. Eshraghian, Principles of CMOS VLSI Design, A Systems Perspective, Second Edition, 1992, p. 191.*

* cited by examiner

*Primary Examiner*—Paul L Rodriguez
*Assistant Examiner*—Juan C Ochoa
(74) *Attorney, Agent, or Firm*—Richard Kotulak; Hoffman Warnick LLC

(57) ABSTRACT

Forming of a statistical model for a set of independently variable parameters for analysis of a circuit design is disclosed. In one embodiment, a method includes establishing a timing model including delay and delay changes due to process parameter variations (Pi) that impact timing; selecting an element of the circuit design that dominates circuit delay in the timing model; determining a delay sensitivity of each of a set of derived process parameters (Vj) for the element that are linear combinations of the process parameter variations (Pi); and selecting only those derived process parameters with a high sensitivity for use in the statistical model. The invention simplifies the statistical model and reduces the number of calculations require for timing analysis. A method of performing a timing analysis using the simplified statistical model is also disclosed.

24 Claims, 7 Drawing Sheets ated endpoints. With the above-described approach, the number of data points requiring testing can be immense. Some approaches also use simulation tolerances including separate, independent variations of the dielectric thickness between wire levels, thus increasing the number of process variations. In any event, resistance and capacitance are calculated for each set of geometries. The designed circuit interconnect structures define the target geometry. Finally, the resistance and capacitance values (non-Gaussian distributions) for the circuit are then used for statistical timing. Unfortunately, the above-described approaches do not minimize the number of parameters necessary, and thus are still very cumbersome.

FORMING STATISTICAL MODEL OF INDEPENDENTLY VARIABLE PARAMETERS FOR TIMING ANALYSIS

BACKGROUND OF THE INVENTION

1. Technical Field

The invention relates generally to circuit design evaluation, and more particularly, to forming a statistical model of independently variable parameters for timing analysis.

2. Background Art

All integrated circuit (IC) manufacturing lines are subject to random variation in process conditions that cause random variation in the chips produced. Chips of the same design will differ in geometry in random ways across processing from chip-to-chip, and geometries of the same design will differ in random ways across a single chip. In order to ensure that a design will function correctly when manufactured, the designer needs to simulate the range of variations expected during the design process. For example, referring to FIG. 1, wire resistance and capacitance depends on: a) the vertical geometry parameters describing the stack heights, especially wire thickness (t) and insulator or via thicknesses (ha or hb), and b) the lateral geometry parameters like wire width (w) and spacing (d) to neighboring wires. Tolerances in width and thickness are the main contributors to process variation of interconnect resistance and capacitance. These parameters are independent.

Statistical timing analysis needs to include simulation of the tolerances of these independent parameters for every wire level. Typically, statistical timing analysis employs a statistical distribution of variations for each parameter, and then analyzes wire delay and circuit performance based on the statistical distributions of variations for each parameter. Accordingly, the more parameters that must be characterized and analyzed, the more cumbersome the task becomes. Conventionally, a large number of geometries need to be evaluated. For example, for a 6 level metal technology, 24 independent timing parameters and 2^24 geometries require evaluation. This number of evaluations is an impossible burden for the timing tool. Also, every metal level simulation has to be performed for nine geometries, e.g., narrow-thin, narrow-thick, wide-thin, wide-thick, each with thick and thin isolator stack and target. This situation changes the regular evaluation (e.g., Spice) file into a file with nine values for every element, significantly increasing the size of the extracted netlist, and costing additional giga-bytes of fast access storage.

One conventional approach to address simulation tolerances in timing analysis includes selecting a set of geometries that bound the process variation distributions. The simulation tolerances include, for example, a target width and maximum changes in width (tracking with space to the neighboring wires) within the boundaries of the width variations, and a target thickness and maximum changes in thickness within the boundaries of the thickness variations. That is, current simulations use: best condition (BC), nominal (NOM) and worst condition (WC) for each wire geometry. All vertical and horizontal dimensions, as shown in FIG. 1, are scaled together with the same relation up to the standard deviation multiple (e.g., 3sigma). This scaling direction sets the parameter varying methodology. The timing tool used to analyze the circuit design assumes linear scaling between the simulated values, i.e., capacitance, resistance and inductance, with the parameter varying methodology. Across chip variation (ACV) of width and thickness require a second set of values for timing in early and late conditions, which are created by linear interpolation between the simul In view of the foregoing, a need exists in the art for an improved approach for forming a statistical model of independently variable parameters for timing analysis.

SUMMARY OF THE INVENTION

Forming of a statistical model for a set of independently variable parameters for analysis of a circuit design is disclosed. In one embodiment, a method includes establishing a timing model including delay and delay changes due to process parameter variations (Pi) that impact timing; selecting an element of the circuit design that dominates circuit delay in the timing model; determining a delay sensitivity of each of a set of derived process parameters (Vj) for this element that are linear combinations of the process parameter variations (Pi); and selecting only those derived process parameters with a high sensitivity for use in the statistical model. The invention simplifies the statistical model and reduces the number of calculations required for timing analysis. A method of performing a timing analysis using the simplified statistical model is also disclosed.

A first aspect of the invention provides a method of forming a statistical model for a set of independently variable parameters for timing analysis of a circuit design, the method comprising the steps of: establishing a timing model including delay and delay changes due to process parameter variations (Pi) that impact timing; selecting an element of the circuit design that dominates circuit delay in the timing model; determining a delay sensitivity of each of a set of derived process parameters (Vj) for the element that are linear combinations of the process parameter variations (Pi); and selecting only those derived process parameters with a high sensitivity for use in the statistical model.

A second aspect of the invention provides a system for forming a statistical model for a set of independently variable parameters for timing analysis of a circuit design, the system comprising: means for establishing a timing model including delay and delay changes due to process parameter variations (Pi) that impact timing; means for selecting an element of the circuit design that dominates circuit delay in the timing model; means for determining a delay sensitivity of each of a set of derived process parameters (Vj) for the element that are linear combinations of the process parameter variations (Pi); and means for selecting only those derived process parameters with a high sensitivity for use in the statistical model.

A third aspect of the invention provides a program product stored on a computer-readable medium, which when executed, forms a statistical model for a set of independently variable parameters for timing analysis of a circuit design, the program product comprising: program code for establishing a timing model including delay and delay changes due to process parameter variations (Pi) that impact timing; program code for selecting an element of the circuit design that dominates circuit delay in the timing model; program code for determining a delay sensitivity of each of a set of derived process parameters (Vj) for the element that are linear combinations of the process parameter variations (Pi); and program code for selecting only those derived process parameters with a high sensitivity for use in the statistical modeling.

A fourth aspect of the invention provides a method of performing a timing analysis of a circuit design using a statistical model for a set of independently variable parameters, the method comprising the steps of: establishing a timing model including delay and delay changes due to process parameter variations (Pi) that impact timing; selecting an element of the circuit design that dominates circuit delay in the timing model; determining a delay sensitivity of each of a set of derived process parameters (Vj) for the element that are linear combinations of the process parameter variations (Pi); selecting only those derived process parameters with a high sensitivity for use in the statistical model; and performing the statistical analysis using the statistical model.

A fifth aspect of the invention provides a computer-readable medium that includes computer program code to enable a computer infrastructure to form a statistical model for a set of independently variable parameters for analysis of a circuit design, the computer-readable medium comprising computer program code for performing the method steps of the invention.

An eighth aspect of the invention provides a business method for forming a statistical model for a set of independently variable parameters for analysis of a circuit design, the business method comprising managing a computer infrastructure that performs each of the steps of the invention; and receiving payment based on the managing step.

A ninth aspect of the invention provides a method of generating a system for forming a statistical model for a set of independently variable parameters for analysis of a circuit design, the method comprising: obtaining a computer infrastructure; and deploying means for performing each of the steps of the invention to the computer infrastructure.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

For purposes of organization only, the detailed description includes the following headings: I. Introduction, II. System Overview, III. Operational Methodology, and IV. Conclusion.

I. Introduction

Figure 1:
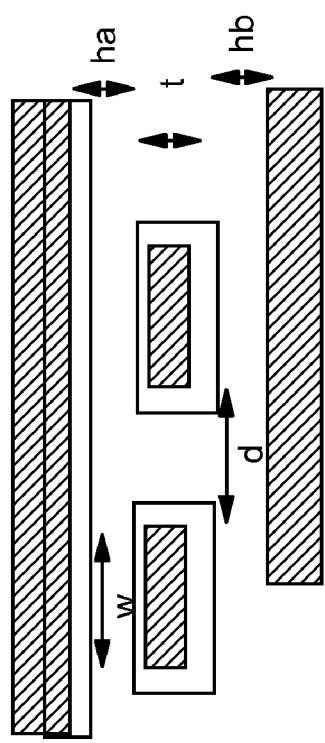
FIG. 1 shows circuit design structure according to prior art.
Figure 2:
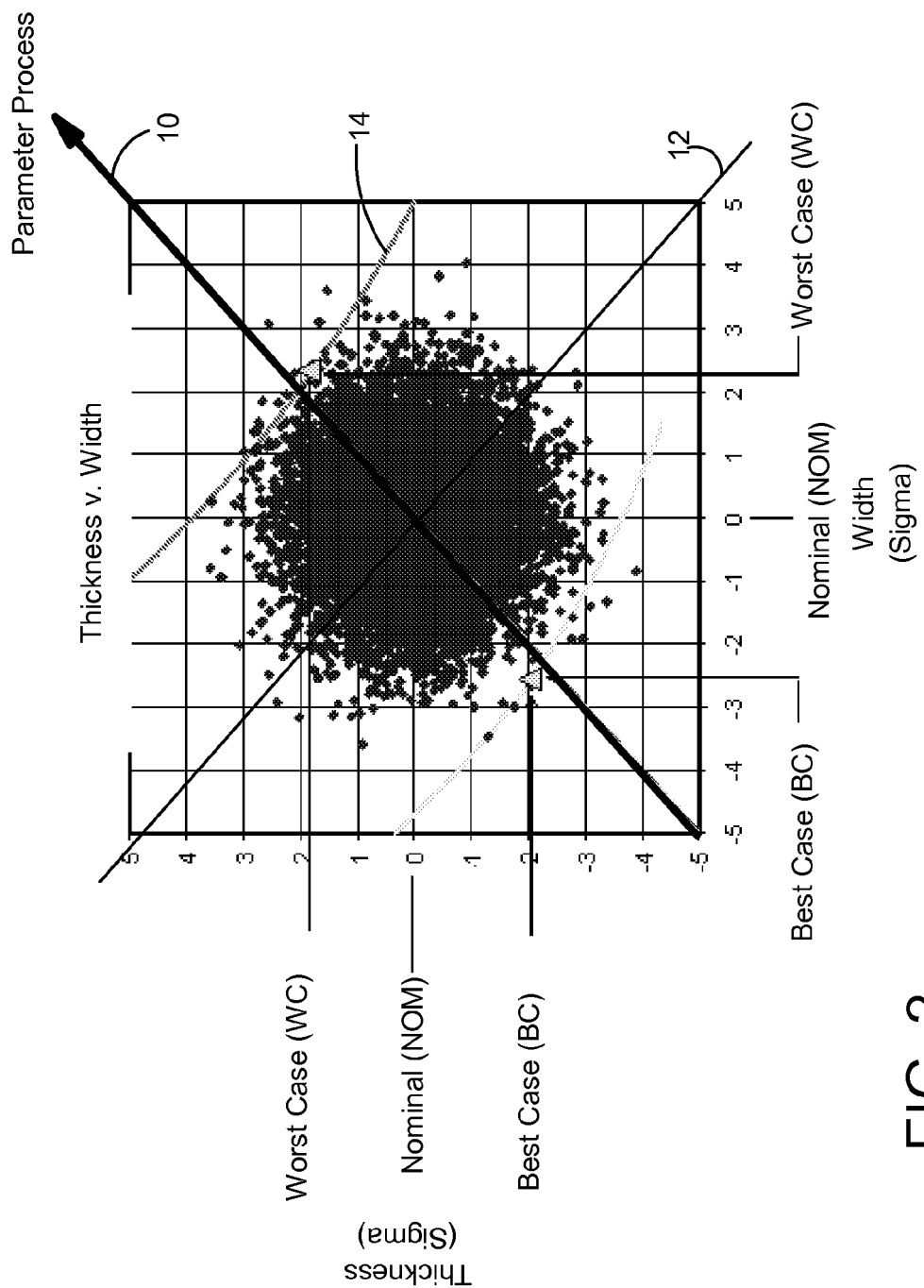
FIG. 2 shows a thickness variation versus width variation data point graph.

As noted above, wire width and thickness are the main independent wire geometry process parameter variations that impact resistance and capacitance, and hence, circuit timing. Because each process parameter variation is independent of each other process parameter variation, a linear combination of those variations is an equivalent set of independent variations. As a result, these variations can be characterized in an equivalent linear combination. For example, FIG. 2 shows a thickness variation versus width variation data point graph, which illustrates linear combinations of the width and thickness process parameter variations. In FIG. 2, the origin of the graph is a nominal (NOM) data point at which no variation to width and thickness for a particular wire is indicated, and the x-axis shows variations in width (+ and −) and the y-axis shows variations in thickness (+ and −). Typically, the statistical model assumes two independent Gaussian distributions for the process parameter variation distributions over many chips. As shown, the lines of equal probability are circular within the width and thickness parameter space, i.e., all of the width and thickness data points result in a circular pattern when thickness variation versus width variation are graphed, as shown in FIG. 2. The multiple standard deviation (e.g., 3sigma) for minimum and maximum resistance occurs close to a diagonal 'process' line 10 in width and thickness variations. Diagonal process line 10 indicates a line upon which width and thickness move together. In this case, all that is required to be known is a single process parameter in the form of a linear combination of width and thickness, i.e., a sum of the width variation and thickness variation. In contrast, an off-diagonal line 12 indicates a line upon which width variation and thickness variation move in opposite directions, i.e., the linear combination of width and thickness in the form of a difference of the width variation and thickness variation. In this case, the two values are required to be known—width variation and thickness variation. (At worst case data point (WC), a resistance minimum width wire line 14 is shown, which indicates a line indicating width-thickness geometries upon which resistance will be the same, i.e., the width and thickness variations results in the same cross-sectional area for the wire.) This graph illustrates how the main process parameter variations, i.e., width and thickness, used in a statistical model for a timing analysis can be combined in linear combinations in such a way that for certain wire widths, i.e., designed minimum width wires, one of these process parameter variations does not lead to a change in resistance and capacitance, which impact delay.

Figure 3:
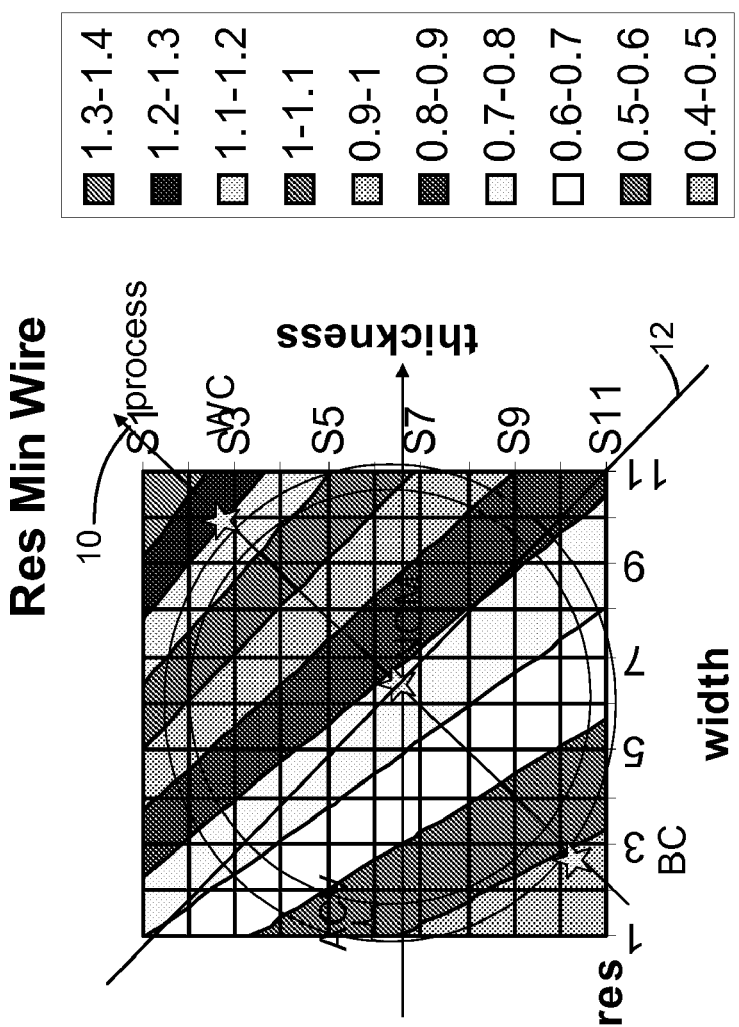
FIG. 3 shows actual calculated resistance for a wire designed to have a minimum width superimposed on the graph of FIG. 2.

To further illustrate, FIG. 3 shows actual calculated resistance for a wire designed to have a minimum width (i.e., smallest possible according to groundrules) superimposed on a graphical representation of the thickness variation versus width variation data point graph of FIG. 2. The different shading represents different resistance values as indicated in the legend. As can be seen, the resistance varies along diagonal process line 10, i.e., the linear combination of width variation and thickness variation moving together line. In contrast, resistance does not vary much along the other (off-diagonal) 45 degree direction line 12 (FIG. 2) for minimum width wire resistance, i.e., where the width variation moves opposite to thickness variation. This indicates that when a minimum width wire is analyzed, a single thickness-and-width process parameter variation is all that is required. That is, the separate width and thickness variations can be omitted from analysis because there is no resistance sensitivity to the difference in width and thickness. Accordingly, for timing runs, only the thickness-and-width process parameter variation needs to be evaluated.

Figure 4:
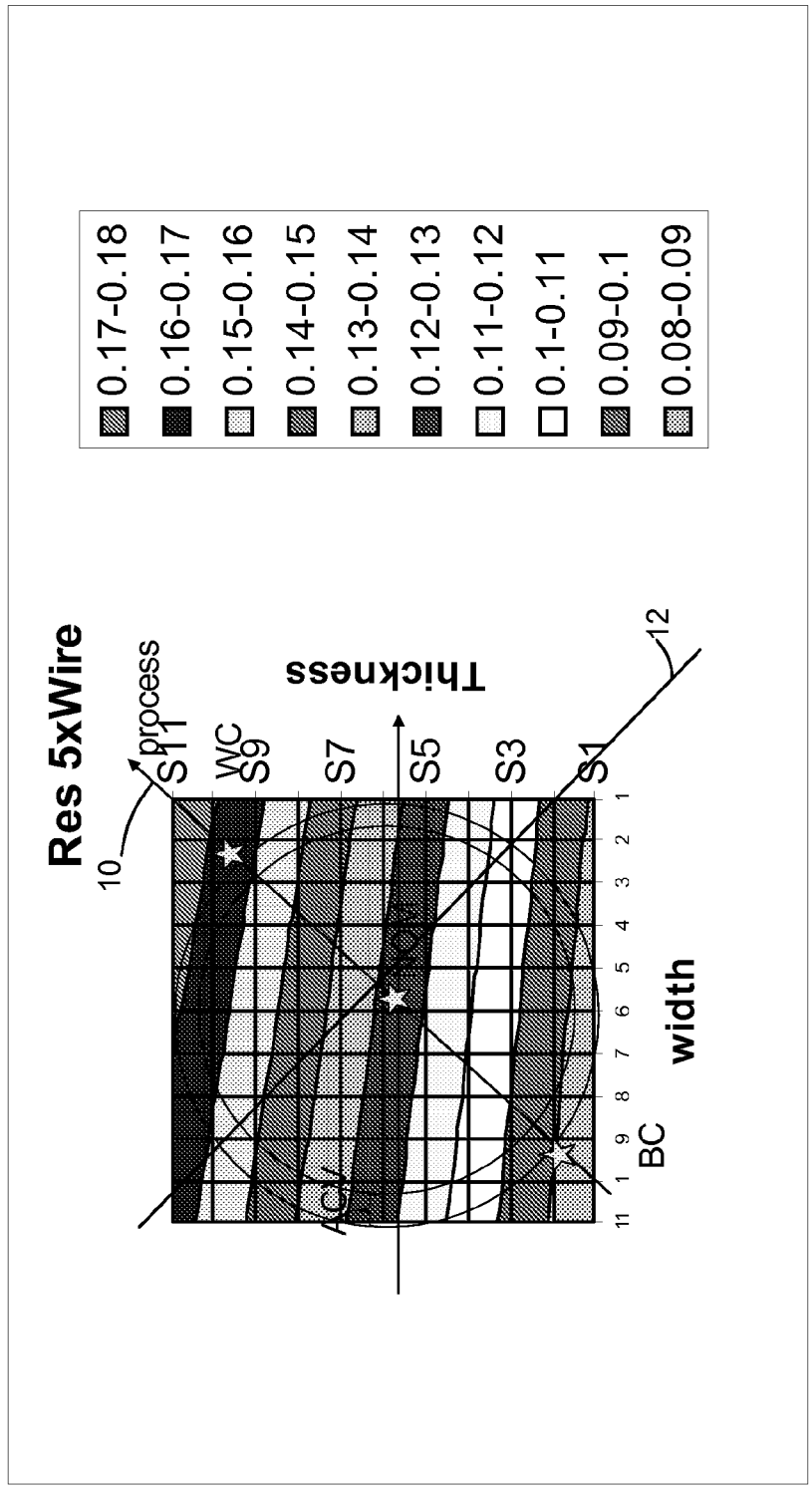
FIG. 4 shows actual calculated resistance for a wire designed to have a non-minimum width superimposed on the graph of FIG. 2.

Turning to FIG. 4, actual calculated resistance for a wire designed to have a non-minimum width (e.g., a wire that is 5× minimum wire) superimposed on a graphical representation of the thickness variation versus width variation data point graph of FIG. 2 is shown. As illustrated in FIG. 4, for non-minimum width wires, use of only the thickness-and-width process parameter variation (i.e., linear combinations of width and thickness along diagonal process line 10) does not work. That is, linear combination values along diagonal process line 10 alone will not capture all of the changes in resistance because resistance changes in the width minus thickness values are noticeable. Accordingly, for non-minimum width wires, both parameters (width variation and thickness variation) must be used. Also noticeable is the fact that the resistance is not impacted much by small variation of width for wide wires, but only thickness variations. That is, resistance of a non-minimal wire behaves differently than for other wider wires. The situation for a wider wire is in contrast to the graph for a minimal width wire shown in FIG. 2, where combining the width variation and thickness variation, as along diagonal process line 10, covers the resistance variation for minimum width wires.

As only geometries which vary in thickness and width in concert are needed for timing of minimum wires, only capacitances and resistances for this correlated geometry need to be extracted to create the circuit net list for timing analysis for minimum wires. In this extraction step the environment and the connectivity of the layout is analyzed. The simplification of this invention also makes this step much more efficient and leads to a smaller net list description.

Based on the above-described situation, according to one embodiment of the invention, a method of forming a statistical model for a set of independently variable parameters for timing analysis of a circuit design is implemented to reduce the number of calculations required for the timing analysis. In particular, the values required for the designed minimum width wires situation are neglected. As a result, a number of calculations required during a timing analysis are reduced, thus reducing resource usage.

II. System Overview

Figure 5:
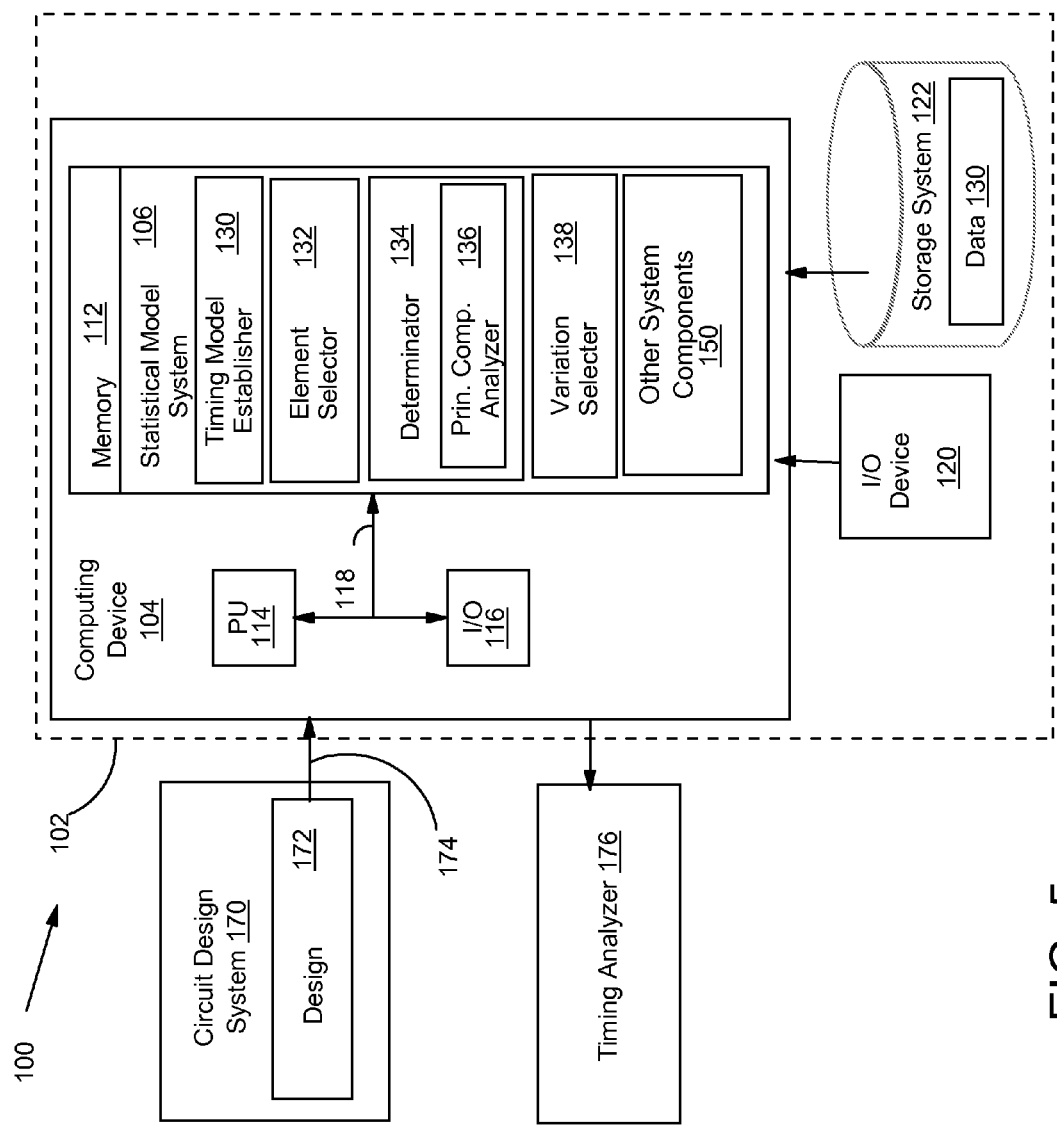
FIG. 5 shows an illustrative environment for forming a statistical model according to the invention.

Turning to the drawings, FIG. 5 shows an illustrative environment 100 for forming a statistical model for a set of independently variable parameters for analysis of a circuit design. To this extent, environment 100 includes a computer infrastructure 102 that can perform the various process steps described herein for increasing power stability in an IC. In particular, computer infrastructure 102 is shown including a computing device 104 that comprises a statistical model system 106 (hereinafter simply "system 106"), which enables computing device 104 to form a statistical model for a set of independently variable parameters for analysis of a circuit design by performing the process steps of the invention.

Computing device 104 is shown including a memory 112, a processor 114, an input/output (I/O) interface 116, and a bus 118. Further, computing device 104 is shown in communication with an external I/O device/resource 120 and a storage system 122. As is known in the art, in general, processor 114 executes computer program code, such as system 106, that is stored in memory 112 and/or storage system 122. While executing computer program code, processor 114 can read and/or write data, such as process parameter variations, artifact dimensions, etc., to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices.

In any event, computing device 104 can comprise any general purpose computing article of manufacture capable of executing computer program code installed by a user (e.g., a personal computer, server, handheld device, etc.). However, it is understood that computing device 104 and system 106 are only representative of various possible equivalent computing devices that may perform the various process steps of the invention. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the invention. For example, in one embodiment, computer infrastructure 102 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

Computer infrastructure 102 can further comprise a circuit design system 170 for generating a circuit design 172 for evaluation. Circuit design system 170 is shown in communication with computing device 104 over a communications link 174. As discussed above, communications link 174 can comprise any combination of various types of communications links as is known in the art. It is understood that circuit design system 170 can comprise the same components (processor, memory, I/O interface, etc.) as shown for computing device 104. These components have not been separately shown and discussed for brevity. Alternatively, system 106 may be provided as part of circuit design system 170. Computer infrastructure 102 can further comprise any now known or later developed timing analyzer 176 for performing a timing analysis using the statistical model formed by system 106. All of the above functionality may be provided in an integrated system, if desired.

As previously mentioned and discussed further below, system 106 enables computing infrastructure 102 to form a statistical model for a set of independently variable parameters for timing analysis of a circuit design. To this extent, system 106 is shown including a timing model establisher 130, an element selector 132, a determinator 134 including a principal component analyzer 136, a variation selector 138, and other system components 150. Other system components 150 may include any other peripheral functionality required for operation of system 106, but not expressly addressed below. Operation of each of the functions of system 106 are discussed further below. However, it is understood that some of the various functions shown in FIG. 5 can be implemented independently, combined, and/or stored in memory for one or more separate computing devices that are included in computer infrastructure 102. Further, it is understood that some of the functions may not be implemented, or additional systems and/or functionality may be included as part of environment 100.

III. Operational Methodology

Figure 6:
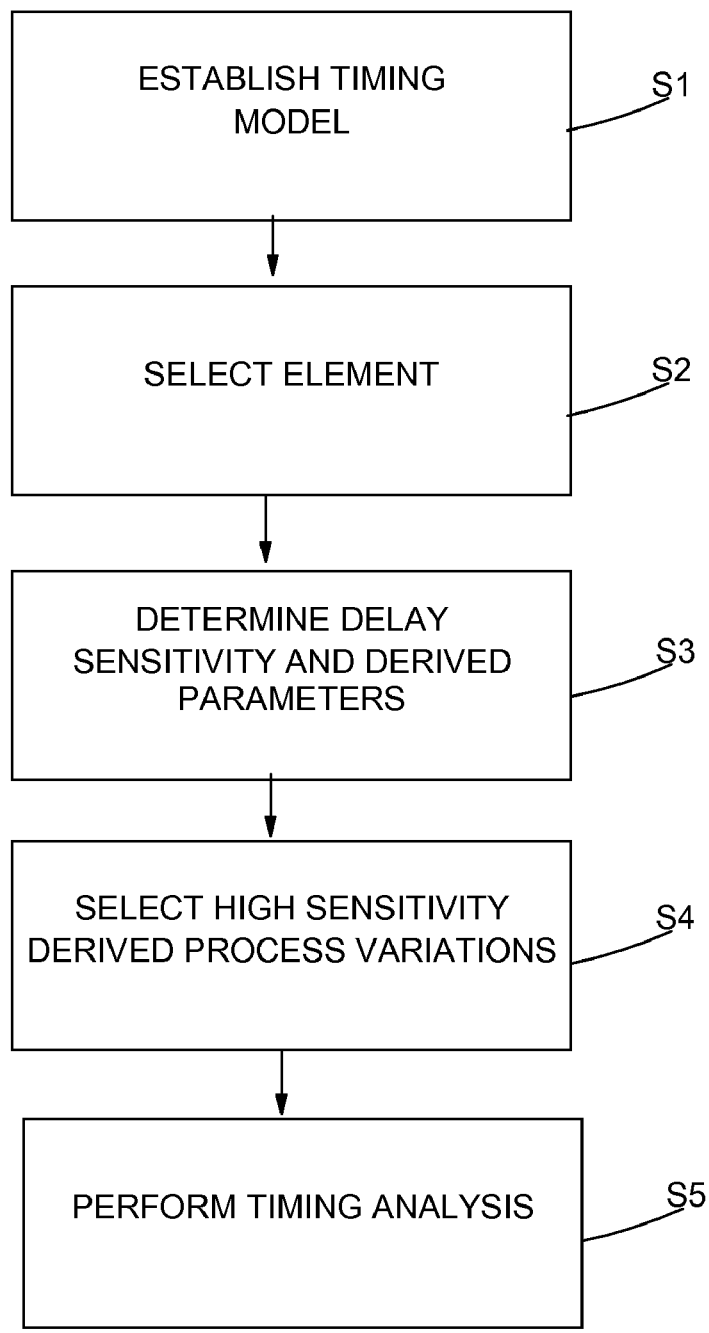
FIG. 6 shows a flow diagram illustrating one method of operation of the system of FIG. 5.

Turning to the flow diagram of FIG. 6 in conjunction with FIG. 5, one embodiment of a method of operation of system 106 will now be described.

In a first step S1, timing model establisher 130 establishes a timing model including delay and delay changes due to process parameter variations (Pi) that impact timing. In one embodiment, timing model establisher 130 begins by selecting a set of geometric process parameter variations which bound the process distributions. In one embodiment, the set of process parameter variations (Pi) includes a width variation (dw) and a thickness variation (dt) for a wire in circuit design 172. That is, the set of process parameter variations may include a target definition and maximum changes in width (tracking with space to the neighboring wires) within the boundaries of the width variations, and maximum changes in thickness within the boundaries of the thickness variations. Other process parameter variations may also include separate, independent variations of the dielectric thickness between wire levels.

Next, this step includes establishing the timing model including the delay and the delay changes due to the process parameter variations (Pi). In this case, delay equals the typical delay with no variations (delay0) plus the sum over all process parameter variations of the derivative of the delay to the process parameter variation multiplied with the range of the process parameter variations (sumi(d delay/dPi*deltaPi)). This process is referred to as a Taylor expansion, and represents a standard canonical timing model for statistical timing analysis. Next, based on this information, resistance and capacitance is calculated by timing model establisher 130 for the given set of geometry variations. The designed circuit interconnect structures define the target geometry. The process parameter variations create changes of these geometries as described above. This step creates each bounding geometries' resistance and capacitance values for circuit design 172. Finally, timing model establisher 130 establishes the timing model by assuming Gaussian distributions for the width and thickness process parameter variations, resulting in derived (not Gaussian any more) distributions of the resistance and capacitance values for circuit design 172.

In step S2, element selector 132 selects an element of circuit design 172 that dominates circuit delay in the timing model. In one embodiment, element selector 132 determines the most frequently used element, e.g., wire segments with inverters or other circuits, that repetitively dominates the delay. In one embodiment, for metallization, element selector 132 may select designed minimum width interconnects as the element because most wires are at minimum thickness, and therefore typically dominate delay.

In step S3, determinator 134 determines a delay sensitivity of each of a set of derived process parameters (Vj) for the element that are linear combinations of the process parameter variations (Pi). In one embodiment, determinator 134 using principal component analyzer 136 performs a principal component analysis to generate the derived process parameter set (Vj) and the delay sensitivity for each derived process parameter. In particular, principal component analyzer 136 calculates a derivative of the delay of the element to the process parameter variations (Pi), and then diagonalizes a matrix of the derivatives in the process parameter variations (Pi) to establish the derived process parameter set and the delay sensitivity. In other words, based on the process parameter variations (Pi), an orthogonal transformation (Tij) is created with the new set of derived process parameters (Vj), which are linear combinations of the process parameter variations (Pi). That is, $Vj = \Sigma i\, Tij\, Pi$, where T is an orthogonal matrix, so that $T^{-1} = T$. T is the matrix of Eigenfunctions calculated after diagonalizing the matrix, which establishes the orthogonal transformation. The related Eigenvalues establish the delay sensitivities, i.e., the sensitivity of the delay to the derived process parameter (Vj). Hence, the principal component analysis indicates which linear combinations of the process parameter variations (Pi) have the largest delay sensitivities. That is, which process parameter variations when combined generate the largest sensitivity in the delay. As will be described below, usage of only the derived process parameters (i.e., linear combinations of process parameter variations) having the highest delay sensitivities reduces the number of calculations required for the timing analysis, and hence reduces resource consumption and the time required to complete a timing analysis.

Figure 7:
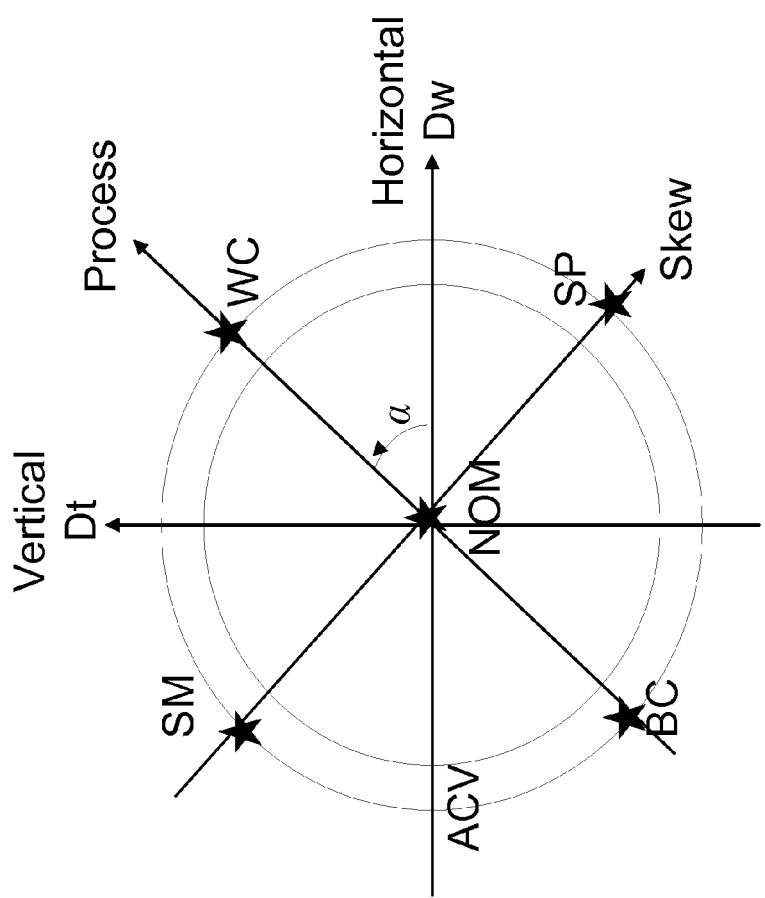
FIG. 7 shows a graphical representation of a thickness variation versus width variation data point graph similar to FIG. 2.

One special situation that allows for greater statistical model simplification is where the derived process parameter set (Vj) includes only two values. In this case, the matrix is very simple and the diagonalizing trivial. As a result, determinator 134 may further simplify the statistical model by optimizing a transformation angle ($\alpha$), which is used to define the linear combination of process parameter variations (Pi). To illustrate, FIG. 7 shows a graphical representation of a thickness variation versus width variation data point graph similar to FIG. 2. As shown in FIG. 7, where the derived process parameter set (Vj) includes only two values, determinator 134 may define a transformation angle ($\alpha$), and then perform an orthogonal transformation in two dimensions, including calculating a transformation value (v), i.e., a set of transformation values. In one embodiment, transformation value (v) is referred to as a skew transformation value calculated as: $\sin(\alpha)*dt - \cos(\alpha)*dw$, where dt is a change in the first derived process parameter value (e.g., thickness) and dw is a change in the second derived process parameter value (e.g., width). Skew transformation values are shown by the off-diagonal line in FIG. 7. Here, boundary data point SP stands for skew plus, and boundary data point SM stands for skew minus. Also shown in FIG. 7, is another transformation value referred to as a process transformation value(s), which is calculated as $\sin(\alpha)*dt + \cos(\alpha)*dw$.

Determinator 134 may then optimize transformation angle ($\alpha$) by first calculating a sensitivity of resistance $\theta_R(\alpha)$ and a sensitivity of capacitance $\theta_C(\alpha)$ to the set of derived process parameters (Vj). The sensitivities can be calculated according to the following: $\theta_R(\alpha) = d(res)/d(v)$, and $\theta_C(\alpha) = d(cap)/d(v)$, where d(res) is a change in resistance, d(cap) is a change in capacitance and d(v) is a change in the transformation value (v). Next, determinator 134 determines the transformation angle that minimizes the resistance sensitivity $\theta_R(\alpha)$ and the capacitance sensitivity $\theta_C(\alpha)$, which is the optimized transformation angle ($\alpha$). The minimum resistance sensitivity $\theta_R(\alpha)$ and capacitance sensitivity $\theta_C(\alpha)$ can be determined in any now known or later developed manner, e.g., creating a table of values of both sensitivities and iterating to the smallest number for both (equivalent to an Eigenvalue analysis). Where the resistance sensitivity $\theta_R(\alpha)$ and the capacitance sensitivity $\theta_C(\alpha)$ are minimized, the skew transformation value(s) (v) (FIG. 7) is irrelevant to timing analysis because resistance and capacitance, which impact delay, do not change with variations of the skew transformation value (v). Thus, those values can be ignored in the statistical model. Typically, the resistance sensitivity $\theta_R(\alpha)$ and the capacitance sensitivity $\theta_C(\alpha)$ should be minimal at the same time. It should be recognized, however, that this is possible only within a range of accuracy defined by the accuracies of the circuit design 172 (FIG. 5). In this fashion, the number of calculations required for a timing analysis can be reduced.

In step S4, variation selector 138 selects only those derived process parameters with a high sensitivity for use in the statistical model. That is, only the derived process parameters having the highest Eigenvalues are used in the statistical model for timing analysis. In one embodiment, variation selector 138 selects a set of derived process parameters having a highest sensitivity of a resistance or a capacitance in the case of a wire (only two values), and highest sensitivity to a delay in the case of a circuit block. As a result, the number of calculations required for the timing analysis is greatly reduced, which reduces resource consumption and the time required to complete the timing analysis.

In step S5, timing analyzer 176 may perform a timing analysis using the statistical model formed in steps S1-S4. It should be recognized that step S5 is not part of the statistical model forming steps.

The impact of the above-described methodology on simplifying the statistical model is significant. In particular, consider that, for metallization, approximately 90% or thereabouts of interconnect wires are of minimum ground-rule geometry (width and/or thickness). In these cases, the above-described transformation angle optimization can be completed and the skew transformation value(s) neglected. That is, the only geometries for which the process transformation value(s) do not cover the resistance and capacitance distributions is when wide wires are being considered. In this case, both the process transformation value(s) and the skew process transformation value(s) must be used in the timing analysis. As a result, in most cases, the skew transformation values can be neglected, thus reducing the number of calculations required in the timing analysis. In addition, the above-described methodology may be applied to a wider range of geometries than just those illustrated herein. In this case, the above-described methodology may create a large number of transformation angles ($\alpha$) that can be optimized for statistical model simplification, e.g., for an n dimensional transformation of process parameter variations (Pi) to derived process parameters (Vj) there are n*(n−1)/2 transformation angles ($\alpha$) capable of optimization. Accordingly, the teachings of the invention are applicable beyond just the geometries illustrated herein, thus expanding the statistical model simplification taught herein.

IV. Conclusion

It is understood that the order of the above-described steps is only illustrative. To this extent, one or more steps can be performed in parallel, in a different order, at a remote time, etc. Further, one or more of the steps may not be performed in various embodiments of the invention.

While shown and described herein as a method and system for forming a statistical model for a set of independently variable parameters for analysis of a circuit design, it is understood that the invention further provides various alternative embodiments. For example, in one embodiment, the invention provides a computer-readable medium that includes computer program code to enable a computer infrastructure to statistically model a set of parameters that are independently variable for analysis of a circuit design or analyzing the circuit design based on the set of parameters that are independently variable. To this extent, the computer-readable medium includes program code, such as system 106 (FIG. 5), which implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 5) and/or storage system 122 (FIG. 5) (e.g., a fixed disk, a read-only memory, a random access memory, a cache memory, etc.).

In another embodiment, the invention provides a business method that performs the process steps of the invention on a subscription, advertising, and/or fee basis. That is, a service provider, such as an Internet Service Provider, could offer to statistically model a set of parameters that are independently variable for analysis of a circuit design or analyze the circuit design based on the set of parameters that are independently variable as described above. In this case, the service provider can manage (e.g., create, maintain, support, etc.) a computer infrastructure, such as computer infrastructure 102 (FIG. 5), that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for forming a statistical model for a set of independently variable parameters for analysis of a circuit design. In this case, a computer infrastructure, such as computer infrastructure 102 (FIG. 5), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computing device 104 (FIG. 5), from a computer-readable medium; (2) adding one or more computing devices to the computer infrastructure; and (3) incorporating and/or modifying one or more existing systems of the computer infrastructure, to enable the computer infrastructure to perform the process steps of the invention.

It is understood that the present invention can also be realized in hardware, software, a propagated signal, or any combination thereof, and may be compartmentalized other than as shown.

As used herein, it is understood that the terms "program code" and "computer program code" are synonymous and mean any expression, in any language, code or notation, of a set of instructions intended to cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a statistical model for a set of independently variable parameters for timing analysis of a circuit design, the method comprising the steps of:
    establishing a timing model including delay and delay changes due to process parameter variations (Pi) that impact timing;
    selecting an element of the circuit design that dominates circuit delay in the timing model, the element being one of a plurality of elements of the circuit design that dominate circuit delay, wherein the plurality of elements consist only of designed minimum width interconnects, the designed minimum width interconnects all having approximately the same linear combination of wire width and wire thickness;
    determining a delay sensitivity of each of a set of derived process parameters (Vj) for the element that are linear combinations of the process parameter variations (Pi);
    selecting only those derived process parameters with a high sensitivity for use in the statistical model, wherein process parameters with high sensitivity are determined to be the process parameters with the largest associated Eigenvalues; and
    forming a statistical model using the derived process parameters with the high sensitivity.

2. The method of claim 1, wherein the derived process parameter selecting step includes selecting a set of derived process parameters having a highest sensitivity of a resistance or a capacitance in the case of a wire and a delay in the case of a circuit block.

3. The method of claim 1, wherein the determining step includes performing a principal component analysis to generate the derived process parameter set and the delay sensitivity for each derived process parameter.

4. The method of claim 3, wherein the principal component analysis includes:
    calculating a derivative of the delay of the element to the process parameter variations (Pi); and
    diagonalizing a matrix of the derivatives in the process parameter variations (Pi) to establish the derived process parameter set and the delay sensitivity.

5. The method of claim 4, wherein, in the case that the derived process parameter set (Vj) includes only two values, the diagonalizing step includes:
    defining a transformation angle ($\alpha$);
    performing an orthogonal transformation in two dimensions, including calculating a skew transformation value (v); and
    optimizing the transformation angle by:
        calculating a sensitivity of resistance $\theta_R(\alpha)$ and a sensitivity of capacitance $\theta_C(\alpha)$ to the set of derived process parameters (Vj), and
        determining the transformation angle that minimizes the resistance sensitivity $\theta_R(\alpha)$ and the capacitance sensitivity $\theta_C(\alpha)$.

6. The method of claim 5, wherein the sensitivity calculating step includes calculating the sensitivities as follows:

$$\theta_R(\alpha)=d(\text{res})/d(v); \text{ and}$$

$$\theta_C(\alpha)=d(\text{cap})/d(v),$$

where d(res) is a change in resistance, d(cap) is a change in capacitance and d(v) is a change in the transformation value (v).

7. The method of claim 1, wherein the set of process parameter variations (Pi) includes a width variation (dw) and a thickness variation (dt) for a wire in the circuit design.

8. A system for forming a statistical model for a set of independently variable parameters for timing analysis of a circuit design, the system comprising:
    at least one computing device including:
    means for establishing a timing model including delay and delay changes due to process parameter variations (Pi) that impact timing;
    means for selecting an element of the circuit design that dominates circuit delay in the timing model, the element being one of a plurality of elements of the circuit design that dominate circuit delay, wherein the plurality of elements consist only of designed minimum width interconnects, the designed minimum width interconnects all having approximately the same linear combination of wire width and wire thickness;
    means for determining a delay sensitivity of each of a set of derived process parameters (Vj) for the element that are linear combinations of the process parameter variations (Pi);
    means for selecting only those derived process parameters with a high sensitivity for use in the statistical model, wherein process parameters with high sensitivity are determined to be the process parameters with the largest associated Eigenvalues; and
    means for forming a statistical model using the derived process parameters with the high sensitivity.

9. The system of claim 8, wherein the derived process parameter selecting means selects a set of derived process parameters having a highest sensitivity of a resistance or a capacitance in the case of a wire and a delay in the case of a circuit block.

10. The system of claim 8, wherein the determining means includes means for performing a principal component analysis to generate the derived process parameter set and the delay sensitivity for each derived process parameter.

11. The system of claim 10, wherein the principal component analysis performing means:
    calculates a derivative of the delay of the element to the process parameter variations (Pi); and
    diagonalizes a matrix of the derivatives in the process parameter variations (Pi) to establish the derived process parameter set and the delay sensitivity.

12. The system of claim 11, wherein, in the case that the derived process parameter set (Vj) includes only two values, the determining means:
    defines a transformation angle ($\alpha$);
    performs an orthogonal transformation in two dimensions, including calculating a skew transformation value (v); and
    optimizes the transformation angle by:
        calculating a sensitivity of resistance $\theta_R(\alpha)$ and a sensitivity of capacitance $\theta_C(\alpha)$ to the set of derived process parameters (Vj), and determining the transformation angle that minimizes the resistance sensitivity $\theta_R(\alpha)$ and the capacitance sensitivity $\theta_C(\alpha)$.

13. The system of claim 12, wherein the determining means calculates the resistance sensitivity $\theta_R(\alpha)$ and the capacitance sensitivity $\theta_C(\alpha)$ as follows:

$$\theta_R(\alpha)=d(\text{res})/d(v); \text{ and}$$

$$\theta_C(\alpha)=d(\text{cap})/d(v),$$

where d(res) is a change in resistance, d(cap) is a change in capacitance and d(v) is a change in the transformation value (v).

14. The system of claim 8, wherein the set of process parameter variations (Pi) includes a width variation (dw) and a thickness variation (dt) for a wire in the circuit design.

15. A program product stored on a computer-readable storage medium, which when executed by a computer system, forms a statistical model for a set of independently variable parameters for timing analysis of a circuit design, the program product comprising:
  program code for establishing a timing model including delay and delay changes due to process parameter variations (Pi) that impact timing;
  program code for selecting an element of the circuit design that dominates circuit delay in the timing model, the element being one of a plurality of elements of the circuit design that dominate circuit delay, wherein the plurality of elements consist only of designed minimum width interconnects, the designed minimum width interconnects all having approximately the same linear combination of wire width and wire thickness;
  program code for determining a delay sensitivity of each of a set of derived process parameters (Vj) for the element that are linear combinations of the process parameter variations (Pi);
  program code for selecting only those derived process parameters with a high sensitivity for use in the statistical modeling, wherein process parameters with high sensitivity are determined to be the process parameters with the largest associated Eigenvalues; and
  program code for forming a statistical model using the derived process parameters with the high sensitivity.

16. The program product of claim 15, wherein the derived process parameter selecting code selects a set of derived process parameters having a highest sensitivity of a resistance or a capacitance in the case of a wire and a delay in the case of a circuit block.

17. The program product of claim 15, wherein the determining code includes program code for performing a principal component analysis to generate the derived process parameter set and the delay sensitivity for each derived process parameter.

18. The program product of claim 17, wherein the principal component analysis performing code:
  calculates a derivative of the delay of the element to the process parameter variations (Pi); and
  diagonalizes a matrix of the derivatives in the process parameter variations (Pi) to establish the derived process parameter set and the delay sensitivity.

19. The program product of claim 18, wherein, in the case that the derived process parameter set (Vj) includes only two values, the determining code:
  defines a transformation angle ($\alpha$);
  performs an orthogonal transformation in two dimensions, including calculating a skew transformation value (v); and
  optimizes the transformation angle by:
    calculating a sensitivity of resistance $\theta_R(\alpha)$ and a sensitivity of capacitance $\theta_C(\alpha)$ to the set of derived process parameters (Vj), and
    determining the transformation angle that minimizes the resistance sensitivity $\theta_R(\alpha)$ and the capacitance sensitivity $\theta_C(\alpha)$.

20. The program product of claim 19, wherein the determining code calculates the resistance sensitivity $\theta_R(\alpha)$ and the capacitance sensitivity $\theta_C(\alpha)$ as follows:

$$\theta_R(\alpha)=d(\text{res})/d(v); \text{ and}$$

$$\theta_C(\alpha)=d(\text{cap})/d(v),$$

where d(res) is a change in resistance, d(cap) is a change in capacitance and d(v) is a change in the transformation value (v).

21. The program product of claim 15, wherein the set of process parameter variations (Pi) includes a width variation (dw) and a thickness variation (dt) for a wire in the circuit design.

22. A method of performing a timing analysis of a circuit design using a statistical model for a set of independently variable parameters, the method comprising the steps of:
  establishing a timing model including delay and delay changes due to process parameter variations (Pi) that impact timing;
  selecting an element of the circuit design that dominates circuit delay in the timing model, the element being one of a plurality of elements of the circuit design that dominate circuit delay, wherein the plurality of elements consist only of designed minimum width interconnects, the designed minimum width interconnects all having approximately the same linear combination of wire width and wire thickness;
  determining a delay sensitivity of each of a set of derived process parameters (Vj) for the element that are linear combinations of the process parameter variations (Pi);
  selecting only those derived process parameters with a high sensitivity for use in the statistical model, wherein process parameters with high sensitivity are determined to be the process parameters with the largest associated Eigenvalues;
  forming a statistical model using the derived process parameters with the high sensitivity; and
  performing the statistical analysis using the statistical model.

23. The method of claim 22, wherein the derived process parameter selecting step includes selecting a set of derived process parameters having a highest sensitivity of a resistance or a capacitance in the case of a wire and a delay in the case of a circuit block.

24. The method of claim 22, wherein the determining step includes performing a principal component analysis to generate the derived process parameter set and the delay sensitivity for each derived process parameter.

* * * * *